United States Patent
Coffey et al.

(10) Patent No.: US 9,276,394 B2
(45) Date of Patent: Mar. 1, 2016

(54) MODULAR POWER DISTRIBUTION SYSTEM AND METHODS

(71) Applicant: ADC Telecommunications, Inc., Berwyn, PA (US)

(72) Inventors: Joseph C. Coffey, Burnsville, MN (US); Bradley Blichfeldt, Savage, MN (US)

(73) Assignee: CommScope Technologies LLC, Hickory, NC (US)

( * ) Notice: Subject to any disclaimer, the term of this patent is extended or adjusted under 35 U.S.C. 154(b) by 131 days.

(21) Appl. No.: 13/901,289

(22) Filed: May 23, 2013

(65) Prior Publication Data
US 2014/0104737 A1    Apr. 17, 2014

Related U.S. Application Data

(63) Continuation of application No. 13/193,246, filed on Jul. 28, 2011, now Pat. No. 8,451,590, which is a continuation of application No. 12/490,911, filed on Jun. 24, 2009, now Pat. No. 7,995,329, which is a
(Continued)

(51) Int. Cl.
*H02H 3/08* (2006.01)
*H02H 3/10* (2006.01)
(Continued)

(52) U.S. Cl.
CPC ............... *H02H 3/006* (2013.01); *H02H 3/08* (2013.01); *H02H 3/10* (2013.01); *H02J 1/108* (2013.01);
(Continued)

(58) Field of Classification Search
CPC ............. H02J 1/14; H02J 1/108; H02H 3/05; H02H 3/00; H02B 1/04; G01F 1/26; H02P 1/28
USPC ........... 361/18, 31, 94, 96, 93.1–93.4, 87, 97, 361/71, 114, 115, 103, 154, 601, 608–624, 361/642–648, 724–727, 823, 831;
307/10.1, 11, 29, 31, 38, 42, 43, 52, 307/64, 70, 71, 112, 113, 147, 360, 125, 307/115, 18, 25; 174/50, 50.52, 48, 59, 60, 174/520; 713/310, 340, 300; 439/55, 65; 312/223.2; 700/292, 294, 299, 300
See application file for complete search history.

(56) References Cited

U.S. PATENT DOCUMENTS 3,590,325 A    6/1971    McMillen et al.
3,846,676 A    11/1974    Ryczek et al.
(Continued)

FOREIGN PATENT DOCUMENTS

CH    300420    10/1954
DE    36 28 130 C1    11/1987
(Continued)

OTHER PUBLICATIONS

Hendry Telephone Products document, 2 pages, entitled "Power Distribution, Flexible Series," dated Feb. 1998, pp. 6 and 7.
(Continued)

*Primary Examiner* — Michail V Datskovskiy
(74) *Attorney, Agent, or Firm* — Merchant & Gould P.C.

(57) ABSTRACT

A modular power distribution system comprises a chassis; and a backplane including a power input, and a plurality of module connection locations. A plurality of modules are mounted in the chassis, each module mounted to one of the module connection locations. Each module includes: (i) an OR-ing diode; (ii) a circuit protection device; (iii) a microprocessor controlling the circuit protection device; and (iv) a power output connection location. A circuit option switch is located on each module for setting the current limits for each module. A control module is provided connected to the backplane.

20 Claims, 4 Drawing Sheets

Related U.S. Application Data continuation of application No. 11/654,367, filed on Jan. 17, 2007, now Pat. No. 7,554,796.

(60) Provisional application No. 60/760,598, filed on Jan. 20, 2006, provisional application No. 60/762,915, filed on Jan. 27, 2006.

(51) Int. Cl.
    *H02H 3/00*     (2006.01)
    *H02J 1/10*     (2006.01)
    *H02M 3/158*     (2006.01)
    *H05K 7/14*     (2006.01)

(52) U.S. Cl.
    CPC ........... *H02M 3/1584* (2013.01); *H05K 7/1459* (2013.01); *Y10T 307/492* (2015.04); *Y10T 307/50* (2015.04); *Y10T 307/653* (2015.04)

(56) References Cited

U.S. PATENT DOCUMENTS

| | | | |
|---|---|---|---|
| 4,271,447 A | 6/1981 | Howell | |
| 4,333,122 A | 6/1982 | Hayden et al. | |
| 4,335,437 A * | 6/1982 | Wilson et al. | 700/293 |
| 4,597,025 A | 6/1986 | Rutchik et al. | |
| 4,652,769 A * | 3/1987 | Smith et al. | 307/31 |
| 4,663,539 A | 5/1987 | Sharp et al. | |
| 4,675,538 A | 6/1987 | Epstein | |
| 4,689,712 A | 8/1987 | Demeyer | |
| 4,777,607 A * | 10/1988 | Maury et al. | 700/286 |
| 4,844,458 A | 7/1989 | Gatchel et al. | |
| 4,996,646 A * | 2/1991 | Farrington | 700/293 |
| 5,068,778 A | 11/1991 | Kosem et al. | |
| 5,079,686 A | 1/1992 | Vinciarelli | |
| 5,122,726 A | 6/1992 | Elliott et al. | |
| 5,170,310 A | 12/1992 | Studtmann et al. | |
| 5,204,800 A | 4/1993 | Wasney | |
| 5,214,560 A | 5/1993 | Jensen | |
| 5,274,767 A | 12/1993 | Maskovyak | |
| 5,311,392 A | 5/1994 | Kinney et al. | |
| 5,335,135 A | 8/1994 | Kinney | |
| 5,357,394 A | 10/1994 | Piney | |
| 5,375,032 A | 12/1994 | Hatakeyama et al. | |
| 5,466,974 A | 11/1995 | Sutrina et al. | |
| 5,485,343 A | 1/1996 | Santos et al. | |
| 5,488,338 A | 1/1996 | Seymour et al. | |
| 5,500,781 A | 3/1996 | Santos et al. | |
| 5,539,605 A | 7/1996 | Pollman et al. | |
| 5,546,265 A * | 8/1996 | Santos et al. | 361/93.2 |
| 5,615,105 A | 3/1997 | Tofigh et al. | |
| 5,623,173 A | 4/1997 | Fasullo et al. | |
| 5,640,061 A | 6/1997 | Bornhorst et al. | |
| 5,675,480 A * | 10/1997 | Stanford | 307/58 |
| 5,682,287 A | 10/1997 | Pollman et al. | |
| 5,712,779 A | 1/1998 | Sheppard et al. | |
| 5,726,506 A | 3/1998 | Wood | |
| 5,740,027 A | 4/1998 | Akers et al. | |
| 5,745,355 A * | 4/1998 | Tracy et al. | 363/71 |
| 5,745,670 A | 4/1998 | Linde | |
| 5,747,972 A | 5/1998 | Baretich et al. | |
| 5,752,047 A * | 5/1998 | Darty et al. | 713/300 |
| 5,754,386 A | 5/1998 | Barbour et al. | |
| 5,875,087 A | 2/1999 | Spencer et al. | |
| 5,940,288 A | 8/1999 | Kociecki | |
| 5,943,204 A | 8/1999 | Jones et al. | |
| 5,969,965 A | 10/1999 | Byrne et al. | |
| 5,973,409 A | 10/1999 | Neibecker et al. | |
| 5,973,416 A | 10/1999 | Guenther | |
| 5,974,545 A * | 10/1999 | Obermeier et al. | 713/1 |
| 6,014,322 A | 1/2000 | Higashi et al. | |
| 6,031,749 A * | 2/2000 | Covington et al. | 363/98 |
| 6,038,126 A | 3/2000 | Weng | |
| 6,055,149 A | 4/2000 | Gillberg et al. | |
| 6,067,023 A | 5/2000 | Bendikas | |
| 6,084,758 A | 7/2000 | Clarey et al. | |
| 6,121,695 A * | 9/2000 | Loh | 307/64 |
| 6,127,882 A | 10/2000 | Vargha et al. | |
| 6,150,734 A | 11/2000 | Neibecker et al. | |
| 6,160,699 A | 12/2000 | Gibson et al. | |
| 6,201,721 B1 | 3/2001 | Suranyi et al. | |
| 6,222,714 B1 | 4/2001 | Hoffman | |
| 6,222,716 B1 | 4/2001 | Chiang et al. | |
| 6,229,288 B1 | 5/2001 | Baretich et al. | |
| 6,240,478 B1 | 5/2001 | Brickell | |
| 6,249,411 B1 | 6/2001 | Hemena et al. | |
| 6,252,365 B1 | 6/2001 | Morris et al. | |
| 6,262,872 B1 | 7/2001 | Messerli et al. | |
| 6,301,133 B1 | 10/2001 | Cuadra et al. | |
| 6,304,462 B1 | 10/2001 | Balakrishnan et al. | |
| 6,317,012 B1 | 11/2001 | Coffey | |
| 6,317,345 B1 * | 11/2001 | Hayward et al. | 363/65 |
| 6,330,142 B1 | 12/2001 | Bellotto et al. | |
| 6,331,933 B1 | 12/2001 | Rumney | |
| 6,356,426 B1 | 3/2002 | Dougherty | |
| 6,366,062 B2 | 4/2002 | Baretich et al. | |
| 6,420,906 B1 | 7/2002 | Kohda | |
| 6,421,215 B1 | 7/2002 | Bushue | |
| 6,448,672 B1 * | 9/2002 | Voegeli et al. | 307/52 |
| 6,452,790 B1 | 9/2002 | Chu et al. | |
| 6,456,203 B1 | 9/2002 | Schomaker et al. | |
| 6,462,926 B1 | 10/2002 | Zaretsky et al. | |
| 6,489,748 B1 | 12/2002 | Okamura | |
| 6,566,848 B2 * | 5/2003 | Horigan et al. | 323/283 |
| 6,611,411 B2 | 8/2003 | Williams et al. | |
| 6,661,119 B2 | 12/2003 | Liu et al. | |
| 6,719,149 B2 | 4/2004 | Tomino | |
| 6,731,487 B2 | 5/2004 | Fletcher et al. | |
| 6,731,523 B2 | 5/2004 | Jitaru | |
| 6,735,704 B1 | 5/2004 | Butka et al. | |
| 6,788,512 B2 | 9/2004 | Vicente et al. | |
| 6,800,962 B2 | 10/2004 | Bahl et al. | |
| 6,815,843 B1 | 11/2004 | Kageyama | |
| 6,856,045 B1 | 2/2005 | Beneditz et al. | |
| 6,873,510 B2 | 3/2005 | Schomaker et al. | |
| 6,876,102 B2 | 4/2005 | Alappat | |
| 6,891,425 B1 | 5/2005 | Huynh | |
| 6,892,115 B2 | 5/2005 | Berkcan et al. | |
| 6,907,331 B2 | 6/2005 | Paquet | |
| 6,937,461 B1 | 8/2005 | Donahue, IV | |
| 6,947,287 B1 | 9/2005 | Zansky et al. | |
| 6,995,964 B2 | 2/2006 | Plemmons et al. | |
| 6,999,291 B2 | 2/2006 | Andarawis et al. | |
| 7,005,996 B2 | 2/2006 | Cabrera et al. | |
| 7,007,179 B2 | 2/2006 | Mares et al. | |
| 7,020,790 B2 | 3/2006 | Mares | |
| 7,038,433 B2 | 5/2006 | Fan et al. | |
| 7,043,543 B2 | 5/2006 | Ewing et al. | |
| 7,054,163 B2 * | 5/2006 | Coffey | 361/796 |
| 7,058,482 B2 | 6/2006 | Fletcher et al. | |
| 7,102,334 B2 | 9/2006 | Wiegand et al. | |
| 7,126,803 B2 | 10/2006 | Schomaker et al. | |
| 7,162,653 B2 | 1/2007 | Mares et al. | |
| 7,171,461 B2 | 1/2007 | Ewing et al. | |
| 7,203,849 B2 | 4/2007 | Dove | |
| 7,212,049 B2 | 5/2007 | Oka | |
| 7,230,813 B1 | 6/2007 | Canova et al. | |
| 7,272,023 B2 | 9/2007 | Schlecht | |
| 7,276,813 B2 | 10/2007 | Dobbs et al. | |
| 7,301,742 B2 | 11/2007 | Tignor et al. | |
| 7,304,828 B1 | 12/2007 | Shvartsman | |
| 7,315,151 B2 | 1/2008 | Thompson et al. | |
| 7,355,301 B2 | 4/2008 | Ockert et al. | |
| 7,365,964 B2 | 4/2008 | Donahue, IV | |
| 7,393,248 B2 | 7/2008 | Best et al. | |
| 7,466,573 B2 | 12/2008 | Kojori et al. | |
| 7,525,782 B1 | 4/2009 | Hedrick et al. | |
| 7,532,955 B2 | 5/2009 | Dougherty | |
| 7,535,690 B2 * | 5/2009 | Fan et al. | 361/92 |
| 7,554,796 B2 | 6/2009 | Coffey et al. | |
| 7,671,490 B2 | 3/2010 | Hartung et al. | |
| 7,747,879 B2 | 6/2010 | Tofigh et al. | |
| 7,851,945 B2 | 12/2010 | William et al. | |
| 7,995,329 B2 | 8/2011 | Coffey et al. | |

(56) References Cited

U.S. PATENT DOCUMENTS

| | | | |
|---|---|---|---|
| 7,999,410 | B2 | 8/2011 | Hartung et al. |
| 2002/0020682 | A1 | 2/2002 | Broome |
| 2002/0085399 | A1 | 7/2002 | Brooks et al. |
| 2002/0109972 | A1 | 8/2002 | Mallette |
| 2002/0125865 | A1 | 9/2002 | Buchanan |
| 2002/0181249 | A1 | 12/2002 | Coffey |
| 2003/0095367 | A1* | 5/2003 | Mares et al. ............. 361/93.7 |
| 2003/0112647 | A1 | 6/2003 | Liu et al. |
| 2003/0179428 | A1* | 9/2003 | Suzuki et al. ............. 359/204 |
| 2004/0017642 | A1 | 1/2004 | Alappat |
| 2004/0113804 | A1 | 6/2004 | Cabrera et al. |
| 2005/0220127 | A1* | 10/2005 | Cane et al. ............. 370/410 |
| 2005/0226013 | A1 | 10/2005 | Fontana |
| 2005/0243491 | A1* | 11/2005 | Tanis ............. 361/104 |
| 2005/0273207 | A1* | 12/2005 | Dougherty ............. 700/292 |
| 2006/0044709 | A1 | 3/2006 | Seiersen |
| 2006/0046766 | A1 | 3/2006 | Hair, III et al. |
| 2006/0071559 | A1 | 4/2006 | Hanson et al. |

FOREIGN PATENT DOCUMENTS

| | | |
|---|---|---|
| EP | 1 517 523 A1 | 3/2005 |
| GB | 2 018 031 A | 10/1979 |
| KR | 9403002 B1 | 4/1994 |
| WO | WO0036726 * | 6/2000 |
| WO | WO 01/72098 A2 | 9/2001 |
| WO | WO 01/76030 A2 | 10/2001 |

OTHER PUBLICATIONS

Hendry Telephone Products document, 2 pages, entitled "Power Distribution, High Density," dated Feb. 1998, pp. 9 and 10.

Hendry Telephone Products document, 2 pages, entitled "Power Distribution, Intelligent," dated Feb. 1998, pp. 17 and 18.

Hendry Telephone Products document, 2 pages, entitled "Power Distribution, Traditional," dated Feb. 1998, pp. 23 and 24.

Telect.com catalog page entitled "Uninterrupted Battery Fuse Panel,", copyright 1999, p. 7.

Telect.com catalog page entitled "Intermediate Fuse Panels," copyright 1999, p. 8.

Telect.com catalog, 2 pages entitled "Circuit Breaker Panel," copyright 1999, pp. 9 and 10.

Telect.com catalog, 2 pages entitled "High Current Circuit Breaker Panel," copyright 1999, pp. 11 and 12.

Telect.com brochure, 2 pages, entitled "Two Fuse Panels in One Rack Space—Intermediate Fuse Panel," dated Jul. 1998.

Printouts from www.telect.com dated Mar. 22, 2000, entitled "Telect, Fuse Panels", 2 pages.

Printouts from www.telect.com dated Mar. 22, 2000, entitled "Telect's Traditional Fuse Panels," 3 pages.

Printouts from www.telect.com dated Mar. 22, 2000, entitled "Telect's Total Front Access Fuse Panels," 2 pages.

Printouts from www.telect.com dated Mar. 22, 2000, entitled "Telect's Intermediate Fuse Panels," 2 pages.

Printouts from www.telect.com dated Mar. 22, 2000, entitled "Telect, Configurable Circuit Breaker Panel," 2 pages.

Printouts from www.telect.com dated Mar. 22, 2000, entitled "Telect's Circuit Breaker Panel," 2 pages.

Printouts from www.telect.com dated Mar. 30, 2000, entitled "Telect's Uninterrupted Battery Fuse Panel," 4 pages.

ADC Telecommunications, Inc., PowerWorx™ Power Distribution Products brochure, dated Aug. 2000.

Drawings from Cisco Systems, Inc. for Stagecoach PDU power distribution panel product, 37 sheets (admitted as prior art).

Hendry Telephone Products power distribution product information pp. 4-9, 12-35, and 38 to 43 (admitted as prior art).

* cited by examiner

__US 9,276,394 B2__

MODULAR POWER DISTRIBUTION SYSTEM AND METHODS

CROSS-REFERENCE TO RELATED APPLICATIONS

This application is a continuation of application Ser. No. 13/193,246, filed Jul. 28, 2011, which is a continuation of application Ser. No. 12/490,911, filed Jun. 24, 2009, now U.S. Pat. No. 7,995,329, which is a continuation of application Ser. No. 11/654,367, filed Jan. 17, 2007, now U.S. Pat. No. 7,554,796, which claims the benefit of provisional application Ser. No. 60/760,598, filed Jan. 20, 2006 and provisional application Ser. No. 60/762,915, filed Jan. 27, 2006, which applications are hereby incorporated by reference in their entirety.

FIELD OF THE INVENTION

The present invention relates to a power distribution panel with circuit element modules.

BACKGROUND OF THE INVENTION

Electrical circuit panels such as power distribution panels typically include a number of different circuit elements such as fuse holders and fuses, circuit breakers, input and output connectors and alarm signal LED's. For safety and other reasons, the electrical circuits of power distribution panels are enclosed within a housing structure. Therefore, the circuit elements listed above have typically been inserted into holes that have been pre-cut or pre-punched into the housing structure, usually on a front or back panel of the housing structure.

These prior circuit panels are fixed and once the holes are formed in the housing, the type and arrangement of the components is limited. In order to manufacture different fixed circuit panels of the prior systems, a circuit panel manufacturer would punch out different patterns of holes in the front or back panels of the housing structure in order to accommodate different arrangements of circuit elements. Significant retooling time and costs are involved for offering different fixed panels. Assembly of the circuit elements is also difficult when the elements are inserted through holes. One solution is described and shown in U.S. Pat. No. 6,456,203.

In addition, such panels are hardwired between the input and output connections, and the fuse and/or breaker locations. In some panels, redundant power connections are provided, controlled by an OR-ing diode including a heat sink. These features can take up significant space within the panel.

There is a continued need for improved power distribution panels.

SUMMARY OF THE INVENTION

A modular power distribution system comprises a chassis; and a backplane including a power input, and a plurality of module connection locations. A plurality of modules are mounted in the chassis, each module mounted to one of the module connection locations. Each module includes: (i) an OR-ing diode; (ii) a circuit protection device; (iii) a microprocessor controlling the circuit protection device; and (iv) a power output connection location. A circuit option switch is located on each module for setting the current limits for each module. A system control module is provided connected to the backplane.

A modular power distribution system comprises a chassis having an open front and an interior; and a backplane positioned opposite to the open front, and including a power input, and a plurality of module connection locations. A plurality of modules are mounted in the interior of the chassis, each module mounted to one of the module connection locations. Each module includes: (i) a rear connector; (ii) a main body; (iii) a circuit protection device; (iv) a front panel; and (v) a power output connection location on the front panel.

DETAILED DESCRIPTION OF THE PREFERRED EMBODIMENTS

Figure 1:
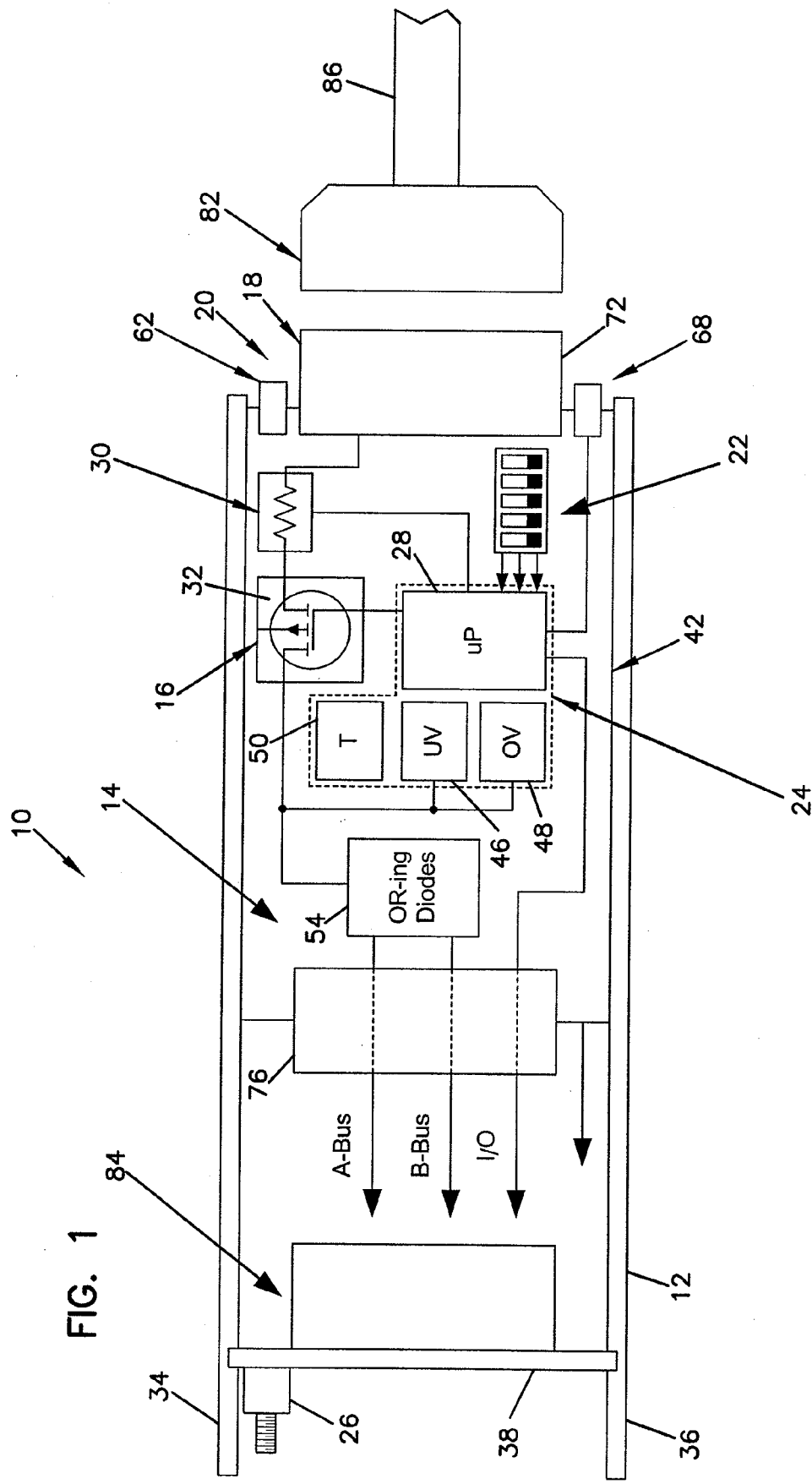
FIG. 1 is a schematic side view of one embodiment of a power distribution panel, with a module partially inserted into the chassis.
Figure 2:
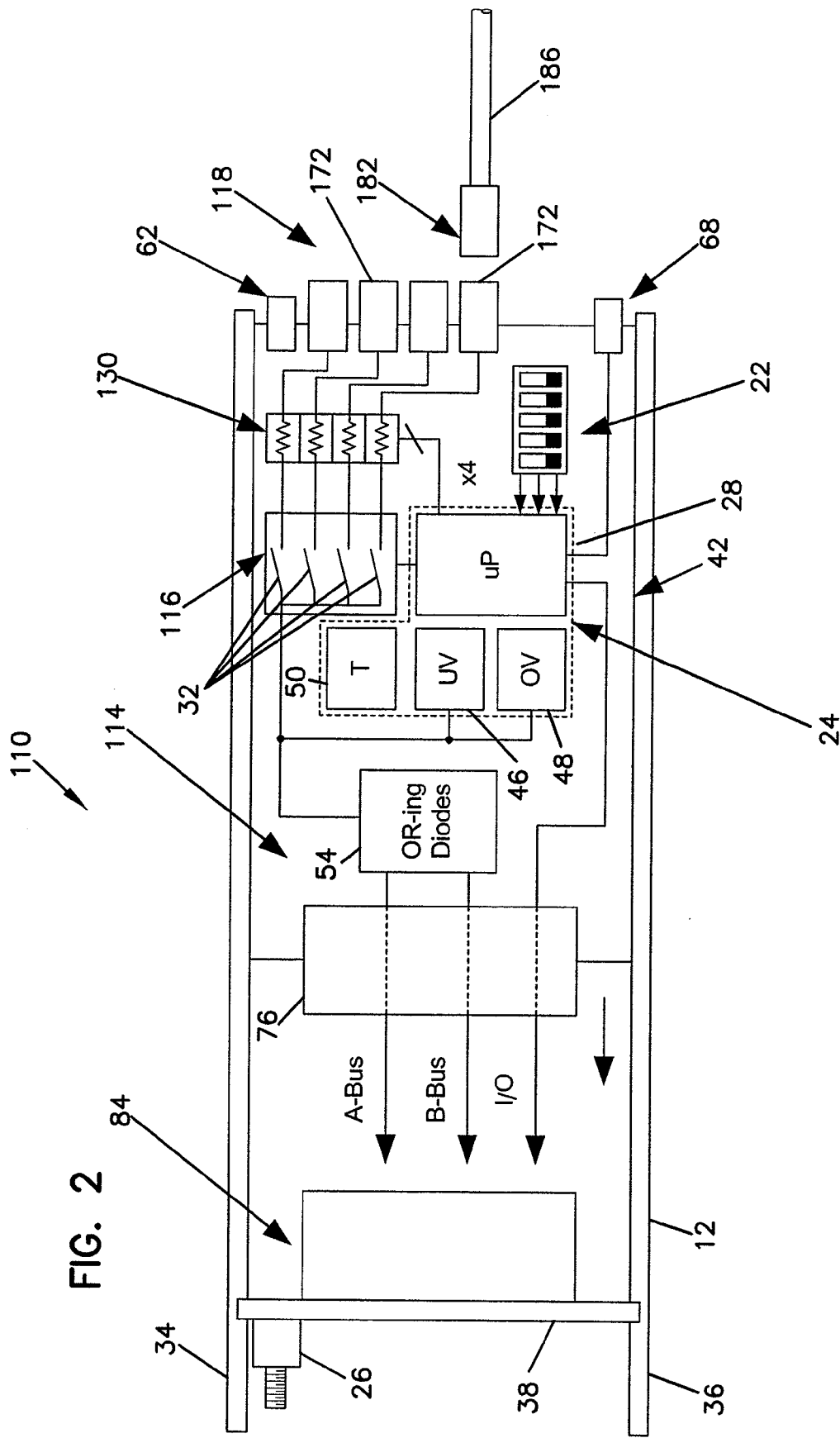
FIG. 2 is a schematic side view of another embodiment of a power distribution panel, with a module partially inserted into the chassis.

Referring to FIGS. 1 and 2, power distribution systems 10, 110 are shown. Power distribution systems 10, 110 are modular designs including a chassis 12 and removable circuit modules 14, 114. Each circuit module 14, 114 includes an electronic breaker 16, 116 for circuit protection, and a port assembly 18, 118 for output power distribution.

Chassis 12 includes a top 34 and a bottom 36. A backplane 38, such as a printed circuit board, provides the interconnection between modules 14, 114 and power input connector 26. Preferably, a second (redundant) power input connector 27 is provided (see FIG. 3).

Modules 14, 114 are received in chassis 12 through a front opening 20. Modules 14, 114 can be removed through front opening 20 as desired to repair, replace or service the modules. Modules 14, 114 can be latched or otherwise attached to chassis 12, as desired.

Modules 14, 114 are similar in many respects for distributing and monitoring the power in systems 10, 110. Modules 14, 114 each include a printed circuit board 42 with circuitry for linking the input power to the output power. Modules 14, 114 differ in the arrangements for the power outputs at port assemblies 18, 118. Module 10 includes a single power output connector 72, such as a high power connector including a DB9-2W2 connector; whereas module 110 includes a plurality of separate power output connectors 172, such as lower power connectors including screw terminals.

The electronic breakers 16, 116 are part of active circuit modules 14, 114 to replace discrete fuses and circuit breaker used in prior art power distribution panels. The end user adds, removes, or upgrades ports in the power distribution system as required by adding or removing circuit modules 14, 114.

Each circuit module 14, 114 can be used as a 1 A, 2 A, 10 A, etc. breaker by setting current limit options switches 22. For example, 2 position DIP switches could be used. Prior art panels with discrete fuses and breakers have a single trip value. Control logic 24 including microcontroller 28 monitors the output current via current sensors 30, 130. If the output current exceeds the limits set by option switches 22, microcontroller 28 will turn-off ("trip") a breaker device 32, which is preferably a solid-state device. The current limit set by the option switches 22 can also be overridden via a software interface from a remote terminal through a control module 40 (see FIGS. 3 and 4). Microprocessor 28 is networked to an external processor through control module 40. If a breaker device 32 is tripped due to the detection of an over current condition, microcontroller 28 will periodically re-enable breaker device 32 to see if the fault still exists. This can eliminate a service visit if the over current was caused by a momentary transient condition.

Microcontroller 28 provides control over breaker device 32. This eliminates disconnects caused by source or load transients. Microcontroller 28 can also set a breaker trip point based on load monitoring over time. Microcontroller 28 is also equipped with a history file that records various conditions local to the individual circuit modules 14, 114. This information is accessible via the control module 40.

Microprocessor 28 can include a load dependent trip control algorithm. This option allows microprocessor 28 to set the breaker trip point for a given load based on a learning algorithm. Microprocessor 28 monitors outgoing current over time (can be a user selectable time period). Microprocessor 28 is configured to calculate a margin of error, then use the new value to create a trip value for each circuit module 14, 114. For example, one circuit module 14 is used in a 30 amp circuit. However, typically the circuit only draws a 27 amp load. Microprocessor 28 recognizes the 27 amp load by monitoring the current load over time, then adds a margin of error (e.g., 1%-5%) to create a load dependent trip value. Therefore, the circuit will trip before 30 amps is ever drawn. Such a system prevents over fusing, and damaged equipment.

Low voltage disconnect (LVD) is localized to the circuit modules 14, 114. Under voltage conditions are monitored by microcontroller 28 with an under voltage sensor 46. If the voltage drops below the recommended level, microcontroller 28 will turn breaker device 32 off to disconnect the load. The same process will occur if an over voltage condition occurs. Over voltage conditions are monitored by microcontroller 28 with an over voltage sensor 48.

To support redundant (dual feed) applications, the OR-ing diodes 54 are localized to the individual circuit modules 14, 114. Prior art power distribution panels that used OR-ing diodes placed them in the input circuits which required very large diodes and heat sinks and created a single point of failure for the system. The arrangement of systems 10, 110 allows the heat dissipated by the OR-ing diodes 54 to be evenly distributed in chassis 12 preventing a localized hot spot. The noted arrangement also reduces the size of the diodes and their respective heat sinks, and eliminates the single point of failure common in prior art power distribution panels. Circuit modules 14, 114 can also include a temperature sensor 50 for monitoring high temperature conditions.

An LED indicator 62 on each circuit module 14, 114 provides a visual status of input and output voltage, output current, temperature, over/under voltage conditions, and breaker trip. A local reset switch 68 is also provided to reset the breaker device 32 after a trip condition has occurred.

In circuit module 14, all input and output to the electronic breaker 16 is via a high current connector 18 to prevent accidental contact by service personnel. Circuit module 14 includes a front connector 72, and a rear connector 76. Front connector 72 connects to cable connector 82 and cable 86 for the output power. Rear connector 76 connects to chassis backplane connector 84 for input power to module 14. The high power connector also prevents polarity reversals.

Front connectors 172 of circuit module 114 each connect to a power output connector 182 and cable 186. Power output connector 182 may be a lug for screw connection to front connector 172.

Systems 10, 110 eliminate internal wiring normally required in prior art power distribution panels. All power and signaling is confined to PCB traces, planes, and bus bars, which improves reliability and reduces assembly cost. Chassis 12 is a passive component that can be reconfigured for a variety of applications. Systems 10, 110 also reduce the number of connections and thermal loss associated with each connection.

All circuit modules 14, 114 in chassis 12 communicate with control module 40. Control module 40 provides access to systems 10, 110 via a laptop serial or network connection for status and alarm information. Control module 40 also provides the external alarms signals common in Telco application. Access to control module 40 is through a front connector 56, or through a rear connector 58 on a back of backplane 38.

Figure 3:
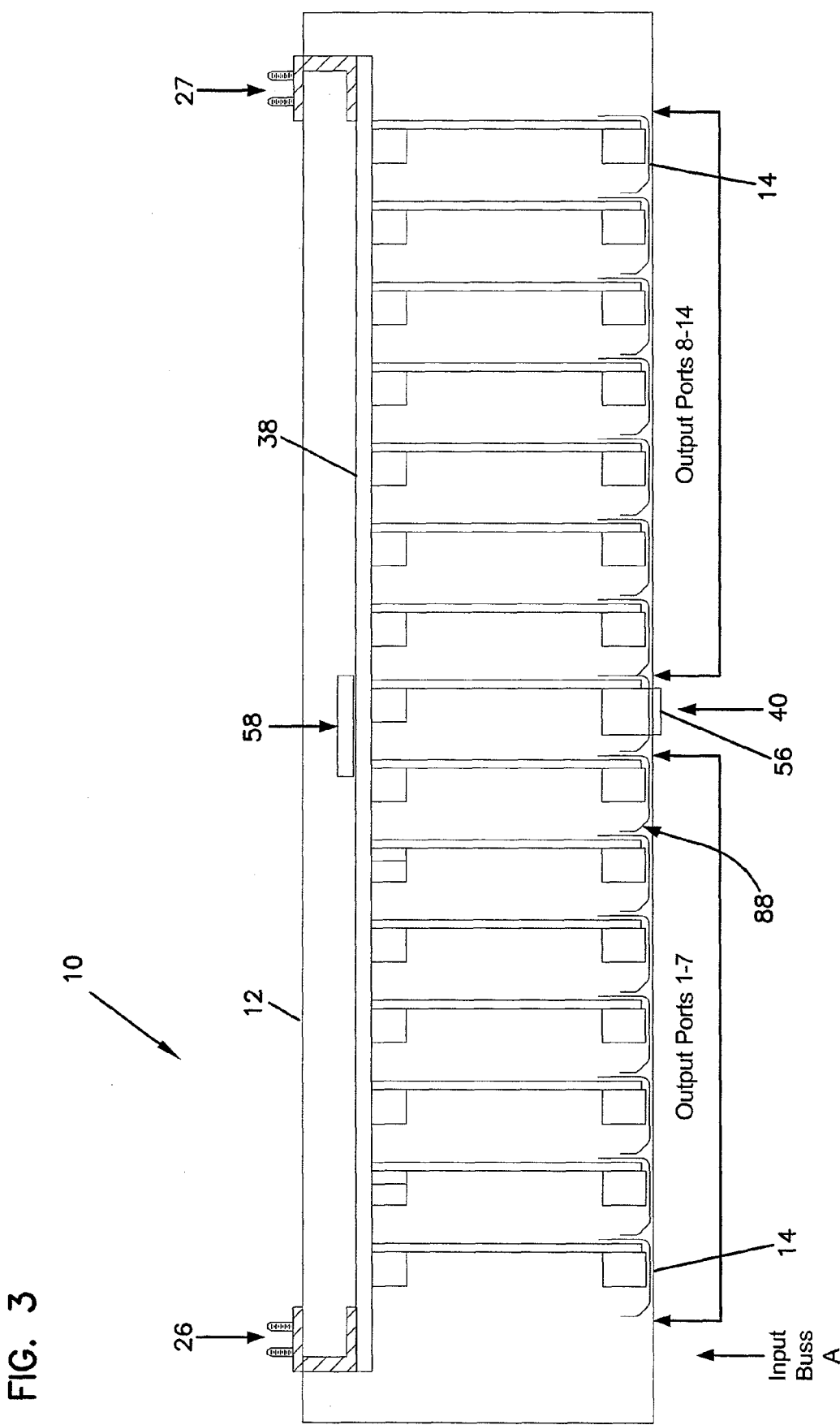
FIG. 3 is a schematic top view of the power distribution panel of FIG. 1.
Figure 4:
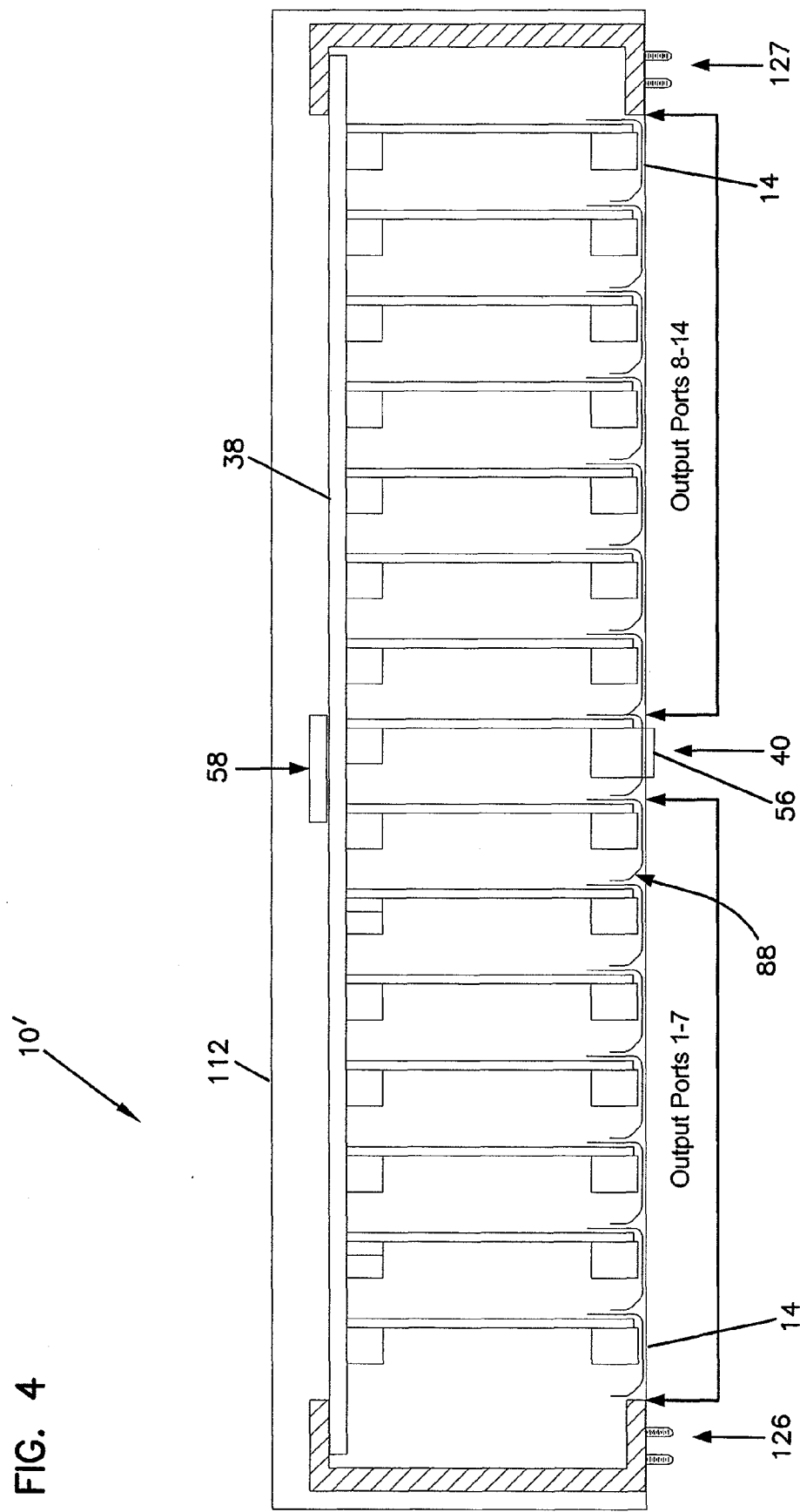
FIG. 4 is a schematic top view of an alternative embodiment of a power distribution panel.

Chassis 12 in FIG. 3 has rear input power connectors 26, 27, and front accessible circuit modules 14. A modified chassis 112 in system 10' as shown in FIG. 4 includes front accessible input power connectors 126, 127.

Circuit modules 14, 114 and control module 40 can be provided with front face plates 86 to protect the interior circuit features. Ventilation holes 88 can be added through front face plates 86, to allow for airflow through systems 10, 10', 110 for cooling of system components.

The above noted panels include modular arrangements for the individual or groupings of circuits. Additional modules can be added as additional circuits are added to the system. By utilizing localized OR-ing, smaller diodes and smaller heat sinks can be used. Additional advantages arise from the localized components associated with each module. In particular, with a localized low voltage disconnect elements, there is no need for a large low voltage disconnect contactors associated with a dedicated panel. Local LED indicators show indicators for each module allowing for improved diagnostics.

We claim:

1. A modular power distribution system comprising:
  (a) a chassis;
  (b) a backplane including a plurality of module connection locations;
  (c) a plurality of modules mounted in the chassis, each module mounted to a module connection location and including:
    (i) a microprocessor-controlled circuit protection device operable at a plurality of selectable trip levels;
    (ii) an OR-ing diode; and
    (iii) a power output connection location on a front of the module.

2. The modular power distribution system of claim 1, wherein at least one of the plurality of modules includes a microprocessor communicatively connected to the microprocessor-controlled circuit protection device of the at least one of the plurality of modules.

3. The modular power distribution system of claim 2, wherein the microprocessor-controlled circuit protection device is tripped based on a load-dependent trip control algorithm performed by the microprocessor.

4. The modular power distribution system of claim 1, further comprising a processor external to the chassis and communicatively connected to at least one of the plurality of modules via a control unit.

5. The modular power distribution system of claim 4, wherein the control unit is configured to access a history file recording conditions associated with each of the plurality of modules.

6. The modular power distribution system of claim 1, wherein each of the plurality of modules includes a low voltage disconnect.

7. The modular power distribution system of claim 6, wherein the low voltage disconnect of each of the plurality of modules comprises a microprocessor-controlled low voltage disconnect.

8. A method of distributing power using a modular power distribution system, the method comprising:
   distributing power through a plurality of modules mounted to a chassis, wherein:
   (i) each module slides into the chassis and connects to the backplane to provide each module with input power;
   (ii) each module includes an OR-ing diode and a microprocessor-controlled circuit protection device operable at a plurality of selectable trip levels;
   (iii) each module provides output power protected by the circuit protection device of each module on a front of the module;
   receiving a current limit from a remote terminal; and
   upon occurrence of a current exceeding the current limit in one of the plurality of modules, tripping the circuit protection device in that module.

9. The method of claim 8, wherein the current limit corresponds to a trip level selected from the plurality of selectable trip levels.

10. The method of claim 8, wherein the current limit is programmed at the remote terminal via a software interface.

11. The method of claim 10, wherein the current limit programmed at the remote terminal overrides a current limit set using one or more switches associated with at least one of the plurality of modules.

12. The method of claim 8, further comprising after a predetermined amount of time after the occurrence of the current exceeding the current limit, resetting the circuit protection device.

13. The method of claim 8, wherein the current limit is received at a control module mounted to the chassis.

14. The method of claim 13, further comprising recording a history file for each of the plurality of modules via a microcontroller associated with that module.

15. The method of claim 14, further comprising accessing the history file via the control module.

16. The method of claim 8, further comprising transmitting status information regarding operation of one or more of the plurality of modules from a control module to a remote computing system.

17. The method of claim 16, wherein the status information includes alarm information associated with a circuit protection event.

18. The method of claim 17, wherein the circuit protection event is selected from the group consisting of:
   detecting an undervoltage condition;
   detecting an overvoltage condition
   detecting a high temperature condition; and
   detecting an overcurrent condition.

19. A method of controlling power distribution via a modular power distribution system, the method comprising:
   providing a power distribution panel including a chassis and a plurality of modules mounted to the chassis, wherein:
   (i) each module slides into the chassis and connects to the backplane to provide each module with input power;
   (ii) each module includes an OR-ing diode and a microprocessor-controlled circuit protection device operable at a plurality of selectable trip levels;
   (iii) each module provides output power protected by the circuit protection device of each module on a front of the module;
   receiving an indication of a current limit at a software interface of a remote computing system; and
   transmitting an indication of the current limit to the power distribution panel to assign to at least one of the plurality of modules; and
   upon occurrence of a current exceeding the current limit in the at least one of the plurality of modules, tripping the circuit protection device in that module.

20. The method of claim 19, wherein the chassis further includes a control module communicatively connected to each of the plurality of modules and to the remote computing system.

* * * * *